(12) United States Patent
Otremba et al.

(10) Patent No.: US 8,975,711 B2
(45) Date of Patent: Mar. 10, 2015

(54) DEVICE INCLUDING TWO POWER SEMICONDUCTOR CHIPS AND MANUFACTURING THEREOF

(75) Inventors: Ralf Otremba, Kaufbeuren (DE); Josef Hoeglauer, Heimstetten (DE); Joachim Mahler, Regensburg (DE); Johannes Lodermeyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 237 days.

(21) Appl. No.: 13/314,438

(22) Filed: Dec. 8, 2011

(65) Prior Publication Data

US 2013/0146991 A1    Jun. 13, 2013

(51) Int. Cl.
*H01L 29/72*    (2006.01)
*H01L 23/00*    (2006.01)
(Continued)

(52) U.S. Cl.
CPC .............. *H01L 24/96* (2013.01); *H01L 23/492* (2013.01); *H01L 21/4857* (2013.01); *H01L 23/5389* (2013.01); *H01L 23/3107* (2013.01); *H01L 21/568* (2013.01); *H01L 25/071* (2013.01); *H01L 25/50* (2013.01); *H01L 2224/40227* (2013.01); *H01L 2224/24105* (2013.01); *H01L 2224/02379* (2013.01); *H01L 2224/82106* (2013.01); *H01L 2224/24135* (2013.01); *H01L 2224/40105* (2013.01); *H01L 24/03* (2013.01); *H01L 24/05* (2013.01); *H01L 24/06* (2013.01); *H01L 24/13* (2013.01); *H01L 24/14* (2013.01); *H01L 24/24* (2013.01); *H01L 24/73* (2013.01); *H01L 24/82* (2013.01); *H01L 2224/02381* (2013.01); *H01L 2224/05548* (2013.01); *H01L 2224/05567* (2013.01); *H01L 2224/05624* (2013.01); *H01L 2224/05647* (2013.01); *H01L 2224/1132* (2013.01); *H01L 2224/11849* (2013.01); *H01L 2224/14181* (2013.01); *H01L 2224/24011* (2013.01); *H01L 2224/2402* (2013.01); *H01L 2224/245* (2013.01); *H01L 2224/73209* (2013.01); *H01L 2224/96* (2013.01); *H01L 2224/1411* (2013.01);
(Continued)

(58) Field of Classification Search
USPC ............ 257/401, E21.506, E23.175, E25.018
See application file for complete search history.

(56) References Cited

U.S. PATENT DOCUMENTS 6,269,014 B1    7/2001    Sander et al.
7,271,470 B1    9/2007    Otremba
(Continued)

FOREIGN PATENT DOCUMENTS

DE          199 35 100 A1       3/2001
DE    10 2005 027 356 A1      12/2006
(Continued)

*Primary Examiner* — Edward Wojciechowicz
(74) *Attorney, Agent, or Firm* — Slater & Matsil, L.L.P.

(57) ABSTRACT

A device includes a first power semiconductor chip with a first contact pad and a second contact pad on a first face and a third contact pad on the second face. The device further includes a second power semiconductor chip with a first contact pad and a second contact pad on a first face and a third contact pad on the second face. The first and second power semiconductor chips are arranged one above another, and the first face of the first power semiconductor chip faces in the direction of the first face of the second power semiconductor chip. In addition, the first power semiconductor chip is located laterally at least partially outside of the outline of the second power semiconductor chip.

26 Claims, 7 Drawing Sheets

(51) Int. Cl.
   *H01L 23/492* (2006.01)
   *H01L 21/48* (2006.01)
   *H01L 23/538* (2006.01)
   *H01L 21/56* (2006.01)
   *H01L 25/07* (2006.01)
   *H01L 25/00* (2006.01)
   *H01L 23/31* (2006.01)

(52) U.S. Cl.
   CPC ............... *H01L 2924/13055* (2013.01); *H01L 2924/13091* (2013.01); *H01L 2224/04105* (2013.01); *H01L 2224/12105* (2013.01); *H01L 2224/131* (2013.01); *H01L 2224/16227* (2013.01); *H01L 2224/16245* (2013.01); *H01L 2224/16225* (2013.01); *H01L 2224/73267* (2013.01); *H01L 2924/13062* (2013.01); *H01L 2924/1306* (2013.01); *H01L 2924/1461* (2013.01); *H01L 2924/1305* (2013.01)
   USPC ............... 257/401; 25/E25.018; 25/E21.506; 25/E23.175

(56) References Cited

U.S. PATENT DOCUMENTS

| | | | |
|---|---|---|---|
| 7,759,777 | B2 | 7/2010 | Otremba et al. |
| 7,807,504 | B2 | 10/2010 | Otremba et al. |
| 7,879,652 | B2 | 2/2011 | Otremba et al. |
| 2004/0021230 | A1* | 2/2004 | Tsai et al. .................... 257/777 |
| 2008/0150105 | A1 | 6/2008 | Hosseini et al. |
| 2008/0251903 | A1 | 10/2008 | Otremba et al. |
| 2009/0236749 | A1 | 9/2009 | Otremba et al. |
| 2009/0278167 | A1* | 11/2009 | Ozoe ........................... 257/139 |

FOREIGN PATENT DOCUMENTS

| | | |
|---|---|---|
| DE | 10 2007 017 831 A1 | 10/2008 |
| DE | 10 2008 034 164 A1 | 3/2009 |
| DE | 10 2009 013 818 A1 | 11/2009 |

* cited by examiner

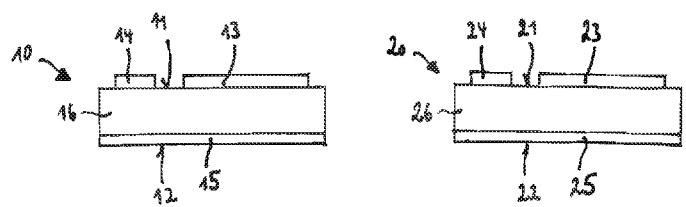
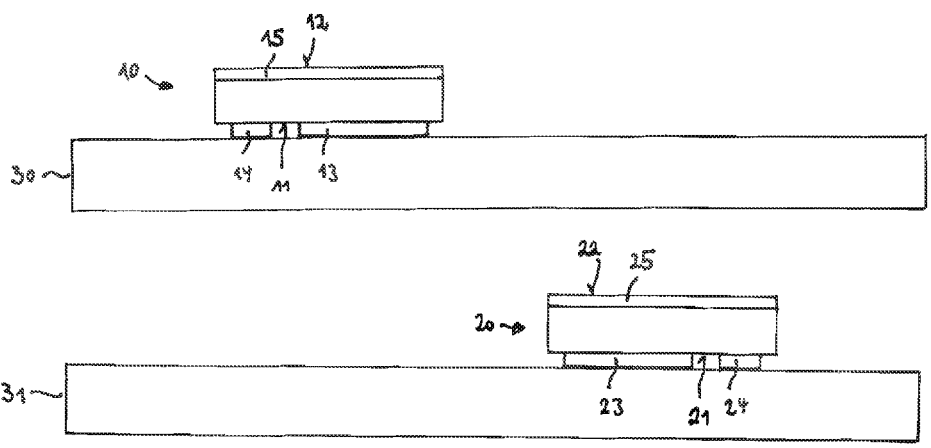
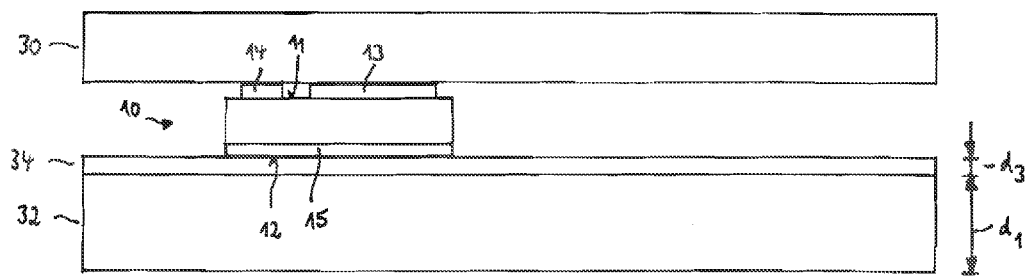
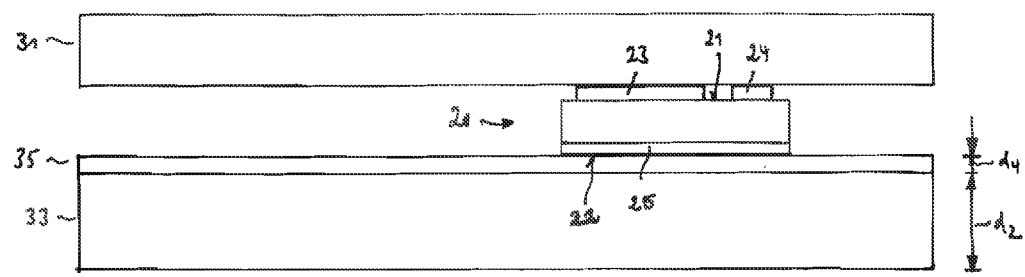

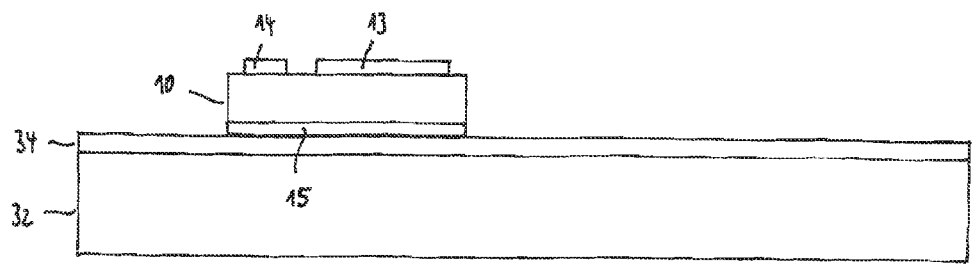
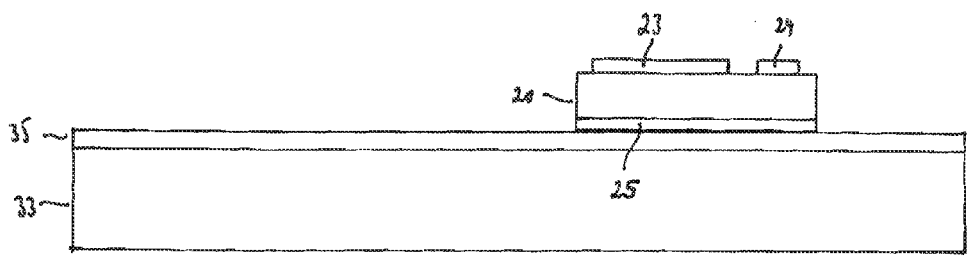
Fig. 2D
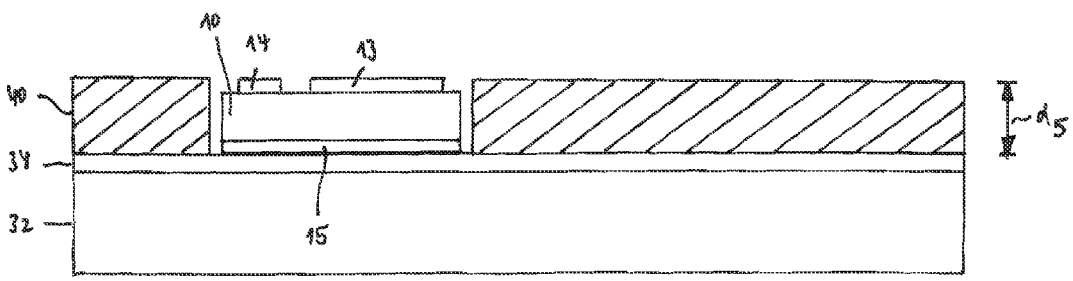
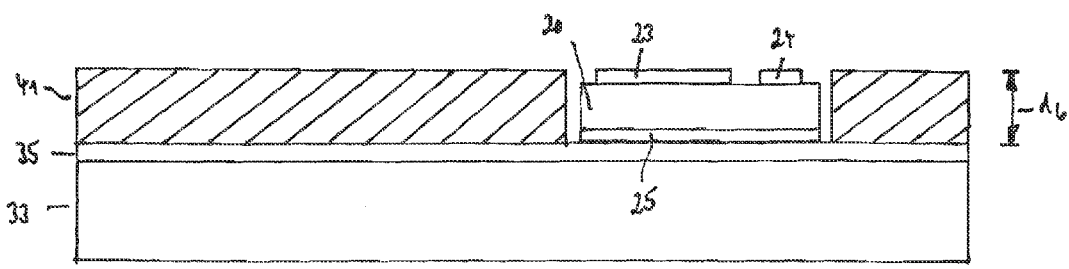
Fig. 2E

DEVICE INCLUDING TWO POWER SEMICONDUCTOR CHIPS AND MANUFACTURING THEREOF

TECHNICAL FIELD

This invention relates to a device including two power semiconductor chips and a method of manufacturing thereof.

BACKGROUND

A power semiconductor chip is a specific type of semiconductor chip designed to handle significant power levels. Power semiconductor chips are suitable, in particular, for the switching and control of currents and/or voltages. They may be implemented as power MOSFETs, IGBTs, JFETs and power bipolar transistors. Power semiconductor chips can be found in most power supplies, DC to DC converters and motor controllers. Power semiconductor chips may be stacked on top of each other for specific applications, such as half-bridge circuits.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
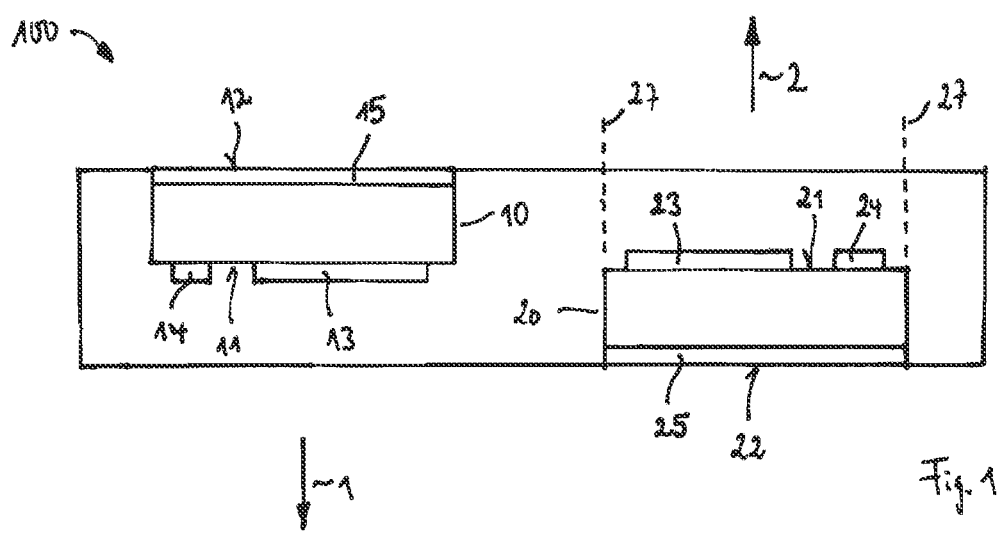
FIG. 1 schematically illustrates a cross-sectional view of one embodiment of a device including two power semiconductor chips arranged one above another.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips, in particular, power semiconductor chips, are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side. In particular, power semiconductor chips may have a vertical structure and have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors) or power bipolar transistors. By way of example, the source electrode and gate electrode of a power MOSFET may be situated on one face, while the drain electrode of the power MOSFET is arranged on the other face. In addition, the devices described below may include integrated circuits to control the integrated circuits of the power semiconductor chips.

The semiconductor chips have contact pads (or contact elements or terminals) which allow electrical contact to be made with the integrated circuits included in the semiconductor chips. The contact pads may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

One or more metal layers having the shape of conductor lines (or conductor tracks) may be provided and may be electrically coupled to the semiconductor chip. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below include external contact pads (or external contact elements), which may be of any shape and size. The external contact pads may be accessible from outside the devices and may thus allow electrical contact to be made with the semiconductor chips from outside the devices. Furthermore, the external contact pads may be thermally conducting and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material. The external contact pads may be formed by portions of the metal layers. Solder material, such as solder balls or solder bumps, may be deposited on the external contact pads.

The semiconductor chips or at least parts of the semiconductor chips may be covered with an encapsulation material, which may be electrically insulating and which may form an encapsulation body. The encapsulation material may be any appropriate duroplastic, thermoplastic or thermosetting material or laminate (prepreg) and may contain filler materials. Various techniques may be employed to encapsulate the semiconductor chips with the encapsulation material, for example, compression molding, injection molding, powder molding, liquid molding or lamination. Heat and/or pressure may be used to apply the encapsulation material.

The encapsulation material may be used to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Each of the devices has at least one mounting surface. The mounting surface serves to mount the device onto another component, for example, a circuit board, such as a PCB (printed circuit board). External contact elements and, in particular, external contact surfaces may be disposed on the mounting surface to allow to electrically couple the device to the component on which the device is mounted. Solder deposits, such as solder balls, or other appropriate connection elements may be used to establish an electrical and, in particular, mechanical connection between the device and the component on which the device is mounted.

FIG. 1 schematically illustrates a cross-sectional view of a device 100. The device 100 includes a first power semiconductor chip 10 with a first face 11 and a second face 12 opposite to the first face 11. A first contact pad 13 and a second contact pad 14 are arranged on the first face 11, and a third contact pad 15 is arranged on the second face 12 of the first power semiconductor chip 10. In addition, the device 100 includes a second power semiconductor chip 20 with a first face 21 and a second face 22 opposite to the first face 21. A first contact pad 23 and a second contact pad 24 are arranged on the first face 21, and a third contact pad 25 is arranged on the second face 22 of the second power semiconductor chip 20.

In the device 100, the first and second power semiconductor chips 10, 20 are arranged one above another. The first face 11 of the first power semiconductor chip 10 faces in a first direction 1, and the first face 21 of the second power semiconductor chip 20 faces in a second direction 2, which is opposite to the first direction 1. Further, the first power semiconductor chip 10 is located laterally at least partially outside of an outline 27 of the second power semiconductor chip 20.

FIGS. 2A-2O, collectively FIG. 2, schematically illustrate an embodiment of a method of manufacturing a device 200, which is illustrated in FIG. 2O. The device 200 is an implementation of the device 100 shown in FIG. 1. The details of the device 200 that are described below can therefore be likewise applied to the device 100. Similar or identical components of the devices 100 and 200 are denoted by the same reference numerals.

FIG. 2A schematically illustrates a first power semiconductor chip 10 and a second power semiconductor chip 20 in a cross-sectional view. The first power semiconductor chip 10 has a first face 11 and a second face 12. A first contact pad 13 and a second contact pad 14 are arranged on the first face 11, and a third contact pad 15 is arranged on the second face 12 of the first power semiconductor chip 10. The second power semiconductor chip 20 has a first face 21 and a second face 22. A first contact pad 23 and a second contact pad 24 are arranged on the first face 21, and a third contact pad 25 is arranged on the second face 22 of the second power semiconductor chip 20. The first and third contact pads 13, 15, 23, 25 of both power semiconductor chips 10, 20 are load electrodes. The second contact pads 14, 24 of both power semiconductor chips 10, 20 are control electrodes.

Each of the first power semiconductor chip 10 and the second power semiconductor chip 20 is configured as a power transistor, for example, a power MOSFET, IGBT, JFET or power bipolar transistor. In the case of a power MOSFET or a JFET, the first contact pad 13, 23 is a source electrode, the second contact pad 14, 24 is a gate electrode, and the third contact pad 15, 25 is a drain electrode. In the case of an IGBT, the first contact pad 13, 23 is an emitter electrode, the second contact pad 14, 24 is a gate electrode, and the third contact pad 15, 25 is a collector electrode. In the case of a power bipolar transistor, the first contact pad 13, 23 is an emitter electrode, the second contact pad 14, 24 is a base electrode, and the third contact pad 15, 25 is a collector electrode. During operation, voltages higher than 5, 50, 100, 500 or 1000 V may be applied between the first and third contact pads 13, 15, 23, 25. The switching frequency applied to the second contact pad 14, 24 may be in the range from 1 kHz to 100 MHz, but may also be outside this range.

The power semiconductor chips 10, 20 include a semiconductor substrate 16, 26, respectively, which is made of an appropriate semiconductor material, for example, Si, SiC, SiGe or GaAs, and contains n- and/or p-doped regions. Each of the contact pads 13-15, 23-25 consists of one or more metal layers applied to the semiconductor substrate 16, 26. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. Each of the individual metal layers may have a specific function. The function of one of the metal layers is to make an electrical contact to the doped regions of the semiconductor substrate 16, 26. Another one of the metal layers functions as a diffusion barrier which protects the semiconductor substrate 16, 26 during a soldering process. A further function of one of the metal layers is that of an adhesion layer, which enables another metal layer to adhere to the semiconductor substrate 16, 26.

In one embodiment, the first and second power semiconductor chips 10, 20 are identical in size. In particular, the surface areas of the first faces 11, 21 of the first and second power semiconductor chips 10, 20 are identical. Further, the heights of the power semiconductor chips 10, 20 may be about 20 μm. In one embodiment, the sizes of the first and second power semiconductor chips 10, 20 are different. For example, the first power semiconductor chip 10, which is used as a low-side switch later on, is larger than the second power semiconductor chip 20, which is used as a high-side switch.

FIG. 2B schematically illustrates sticky carrier foils 30, 31. The first and second power semiconductor chips 10, 20 are releasably attached to the sticky carrier foils 30, 31, respectively, with their first faces 11, 21 facing the sticky carrier foils 30, 31. Thus, the first and second contact pads 13, 14, 23, 24 adhere to the sticky carrier foils 30, 31. A pick-and-place machine may be used to place the power semiconductor chips 10, 20 on the sticky carrier foils 30, 31.

FIG. 2C schematically illustrates carriers 32, 33. The carriers 32, 33 may be made of copper or other appropriate materials, for example, nickel, steel, stainless steel, laminate, or a material stack. Each of the carriers 32, 33 has at least one flat face on which components of the device 200 can be placed. The shape of the carriers 32, 33 is not limited to any geometric shape, for example, the carriers 32, 33 are round or square-shaped. The carriers 32, 33 have any appropriate size and a thickness $d_1$, $d_2$, respectively. In one embodiment, the carriers 32, 33 have the same thickness $d_1$, $d_2$. In one embodiment, the thicknesses $d_1$, $d_2$ are about 70 μm.

Metal layers 34, 35 are arranged on the carriers 32, 33, respectively. In one embodiment, the metal layers 34, 35 are copper foils. The metal layers 34, 35 may be attached to the carriers 32, 33 by means of an adhesive tape, for example, a double sided sticky tape. The metal layers 34, 35 have a thickness $d_3$, $d_4$, respectively. In one embodiment, the metal layers 34, have the same thickness $d_3$, $d_4$. In one embodiment, the thicknesses $d_3$, $d_4$ are about 12 μm.

The sticky carriers foils 30, 31 are placed over the carriers 32, 33 such that the power semiconductor chips 10, 20 are attached to the metal layers 34, 35, with the second faces 12, 22 of the power semiconductor chips 10, 20 facing the metal layers 34, 35.

In one embodiment, the power semiconductor chips 10, 20 are electrically and mechanically coupled to the metal layers 34, 35, respectively, by diffusion soldering. For that, a solder material is deposited on the third contact pads 15, 25 or, alternatively, on the third contact pads 15, 25 and the contact areas of the metal layers 34, 35. In one embodiment, the solder material is deposited on the third contact pads 15, 25 when the power semiconductor chips 10, 20 are still in the wafer bond, which means that the solder material is deposited on the semiconductor wafer before the semiconductor wafer is singulated in order to produce individual semiconductor chips. In one embodiment, the solder material consists of AuSn, AgSn, CuSn, Sn, AuIn, AgIn, AuSi or CuIn.

In one embodiment, the power semiconductor chips 10, 20 and the carriers 32, 33 together with the metal layers 34, 35 are placed in an oven and are heated to an appropriate temperature in order to melt the solder material. During the soldering process the power semiconductor chips 10, 20 may be pressed onto the metal layers 34, 35 for an appropriate time. The solder material then produces a metallic joint between the power semiconductor chips 10, 20 and the metal layers 34, 35, which is able to withstand high temperatures through the fact that the solder material forms a temperature-resistant and highly mechanically stable intermetallic phase with high-melting materials of the third contact pads 15, 25 and the metal layers 34, 35. The intermetallic phase has a higher melting temperature than the solder material used to generate the intermetallic phase. In the process, the low-melting solder material is completely transformed, i.e., it passes completely into the intermetallic phase. In one embodiment, the power semiconductor chips 10, 20 and the metal layers 34, 35 are exposed to a temperature of about 250° C. for 45 minutes.

In one embodiment, the power semiconductor chips 10, 20 are electrically and mechanically coupled to the metal layers 34, 35, respectively, by an electrically conductive adhesive. The electrically conductive adhesive may be based on epoxy resins and be enriched with gold, silver, nickel or copper in order to produce the electrical conductivity. The adhesive may be stencil printed on the metal layers 34, 35 before placing the power semiconductor chips 10, 20 over the metal layers 34, 35. The adhesive may be heated to a certain temperature to cure the adhesive.

FIG. 2D schematically illustrates the power semiconductor chips 10, 20 that are firmly attached to the metal layers 34, 35, respectively, and after the sticky carrier foils 30, 31 have been removed. Although FIG. 2D shows only one first power semiconductor chip 10 and one second power semiconductor chip 20, more first and second power semiconductor chips 10, may be attached to the metal layers 34, 35, respectively. For example, more than 50 or 100 or 500 first and second power semiconductor chips 10, 20 may be attached to the metal layers 34, 35, respectively.

The exposed surfaces of the metal layers 34, 35 are roughened by an etching process in order to improve the adhesion of the laminate which is deposited onto the metal layers 34, 35 in the next step.

FIG. 2E schematically illustrates lamination foils 40, 41, which are attached to the metal layers 34, 35, respectively. In one embodiment, the power semiconductor chips 10, 20 are not covered with the lamination foils 40, 41. The lamination foils 40, 41 have a thickness $d_5$, $d_6$, respectively, which may be identical. In one embodiment, the thicknesses $d_5$, $d_6$ are about 35 μm.

The lamination foils 40, 41 are made of an appropriate dielectric material, for example, a polymer material. In one embodiment, the polymer material is a prepreg that is a combination of a fiber mat, for example, glass or carbon fibers, and a resin, for example, a duroplastic material. Prepreg materials are usually used to manufacture PCBs. Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. Prepreg materials are bi-stage materials, which are flexible when applied to the metal layers 34, and hardened during a heat-treatment. For the lamination of the prepreg the same or similar process steps can be used as in PCB manufacturing.

Figure 2F:
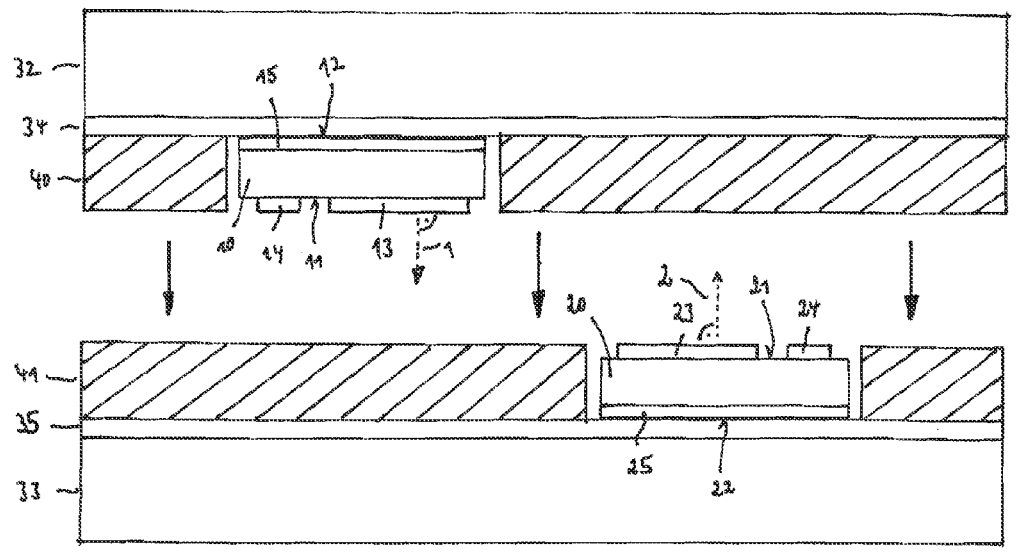
FIGS. 2A-2O schematically illustrate a cross-sectional view of one embodiment of a method including arranging two power semiconductor chips in a face-to-face position above each other and coupling the two power semiconductor chips to each other.

FIG. 2F schematically illustrates that the carrier 32 is placed over the carrier 33 such that the first face 11 of the first power semiconductor chip 10 faces in a first direction 1, while the first face 21 of the second power semiconductor chip 20 faces in a second direction 2. In one embodiment, the first direction 1 is orthogonal to the first face 11 of the first power semiconductor chip 10, the second direction 2 is orthogonal to the first face 21 of the second power semiconductor chip 20, and the first direction 1 and the second direction 2 form an angle of 180°. In particular, the first face 11 of the first power semiconductor chip 10 faces in the direction of the first face 21 of the second power semiconductor chip 20.

Figure 2G:
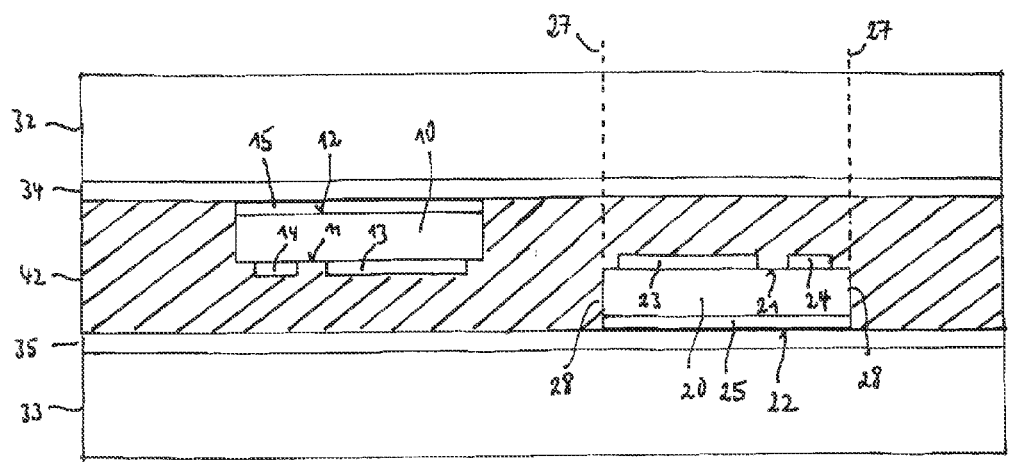

FIG. 2G schematically illustrates that the carrier 32 is subsequently pressed on the carrier 33. Heat and pressure are applied to laminate the lamination foils 40, 41 together thereby producing a lamination layer 42. The lamination layer 42 encapsulates the power semiconductor chips 10, 20 and covers the first faces 11, 21 and the side faces of the power semiconductor chips 10, 20. Further, the first power semiconductor chip 10 is located laterally at least partially outside of an outline 27 of the second power semiconductor chip 20. The outline 27 may be defined by the side faces 28 of the second power semiconductor chip 20. Thus, in one embodiment, a first portion of the first power semiconductor chip 10 is located within the outline 27 of the second power semiconductor chip 20, and a second portion of the first power semiconductor chip 10 is located outside of the outline 27 of the second power semiconductor chip 20. In one embodiment, the first power semiconductor chip 10 is located laterally fully outside of the outline 27 of the second semiconductor chip 20. The vertical distance between the two power semiconductor chips 10, 20 can be varied by varying the thicknesses $d_5$, $d_6$ of the lamination foils 40, 41.

Figure 2H:
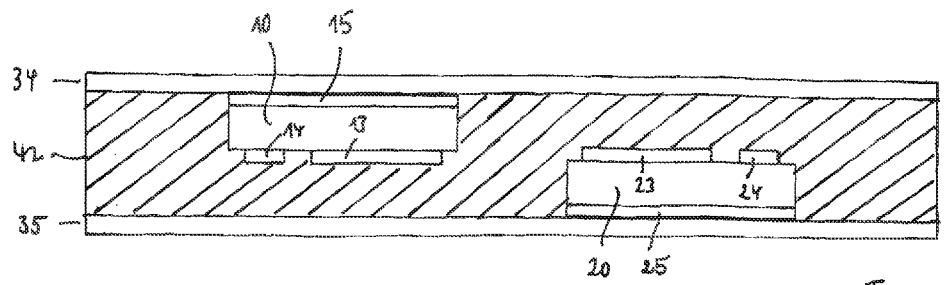

FIG. 2H schematically illustrates that the carriers 32, 33 are removed. If the carriers 32, 33 were attached to the metal layers 34, 35 by means of adhesive tapes, the adhesive tapes are also removed.

Figure 2I:
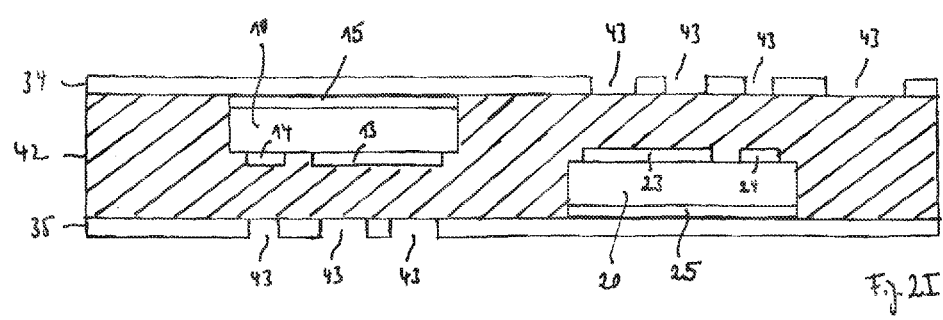

FIG. 2I schematically illustrates the metal layers 34, 35 after a structuring step in order to define the position of vias. For this purpose dry resist films may be laminated on the metal layers 34, 35 (not illustrated in FIG. 2I), which are photostructurable. Recesses may be formed in the resist films by exposure to light having a suitable wave-length. For that, a laser beam or light exposure through a mask may be employed. Subsequently, the resist films are developed and the thereby exposed portions of the metal layers 34, 35 are etched and recesses 43 are created in the metal layers 34, 35. Afterwards the resist films are stripped off, and only the structured metal layers 34, 35 remain as illustrated in FIG. 2I.

Figure 2J:
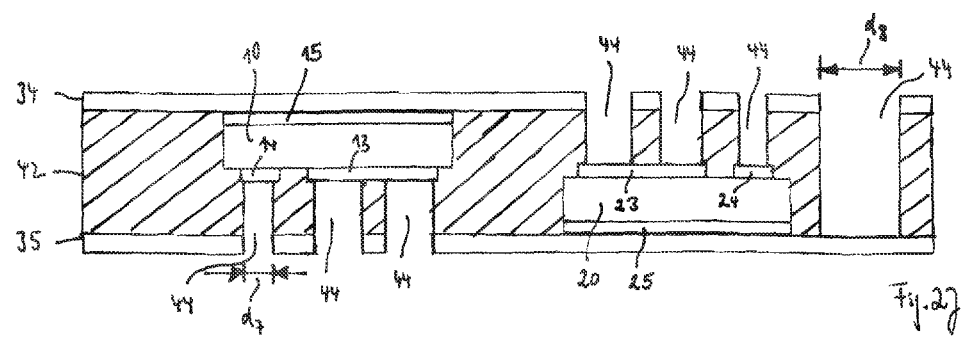

FIG. 2J schematically illustrates through-holes 44 through the lamination layer 42. The through-holes 44 are created by laser drilling at the positions of the recesses 43 in the metal layers 34, 35. The through-holes 44 expose at least portions of the first and second contact pads 13, 14, 23, 24 of the power semiconductor chips 10, 20. At least one of the through-holes 44 reaches from a recesses 43 in the metal layer 34 through the entire lamination layer 42 to the metal layer 35 and thus exposes a portion of the metal layer 35. The through-holes 44 exposing portions of the first and second contact pads 13, 14, 23, 24 of the power semiconductor chips 10, have a diameter $d_7$, which is, for example, about 70 μm. The through-holes 44 exposing portions of the metal layer 35 have a diameter $d_8$, which is, for example, about 100 μm.

Figure 2K:
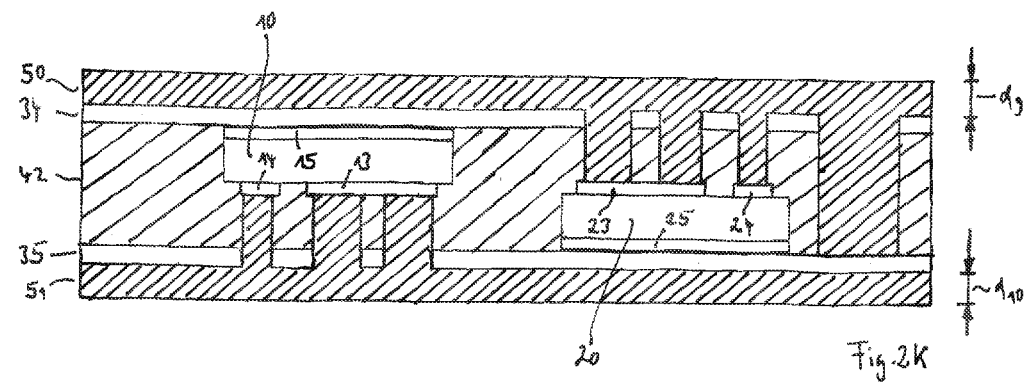

FIG. 2K schematically illustrates metal layers 50, 51 that are deposited on the metal layers 34, 35, respectively, by using a galvanic plating process. The material of the metal layers 50, 51 may be any appropriate metal or metal alloy, for example, copper or aluminum. The metal layers 50, 51 also fill the through-holes 44 created in the lamination layer 42. The metal layers 50, 51 form vias in the lamination layer 42 and electrically couple the first and second contact pads 13, 14, 23, 24 of the power semiconductor chips 10, 20 to the metal layers 34, 35. The metal layers 50, 51 have a thickness $d_9$, $d_{10}$, respectively, which may be about 38 μm.

Figure 2L:
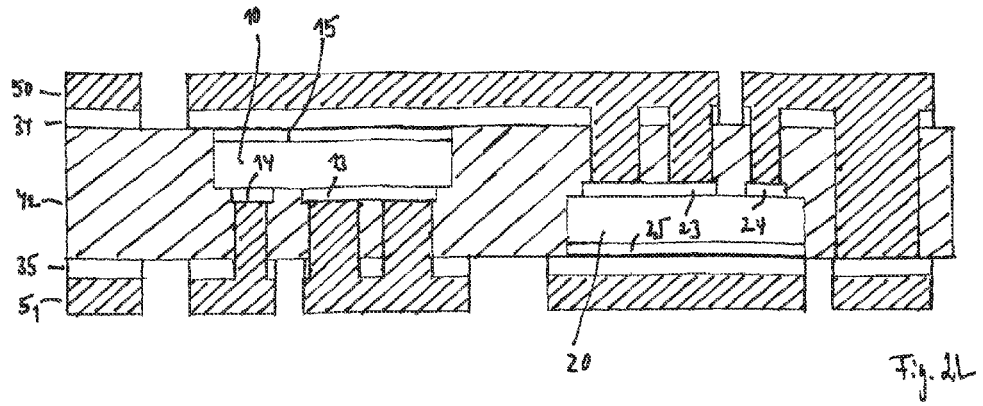

FIG. 2L schematically illustrates the metal layers 34, 35, 50, 51 after a structuring step in order to produce the external contact pads described below. In addition, the metal layers 34, 50 are structured such that the third contact pad 15 of the first power semiconductor chip 10 is electrically coupled to the first contact pad 23 of the second power semiconductor chip 20. Further, the exposed surfaces of the metal layers 50, 51 are roughened by an etching process in order to improve the adhesion of the solder resist which is deposited onto the metal layers 50, 51 in the next step.

Figure 2M:
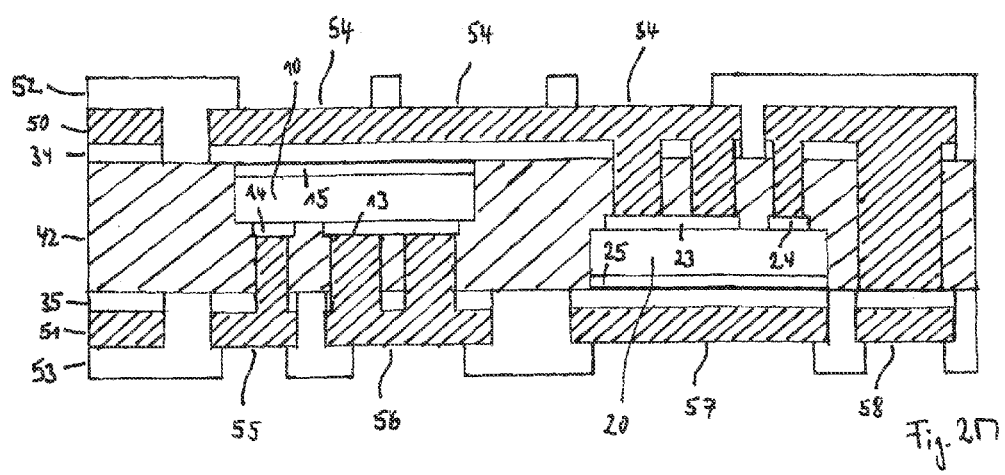

FIG. 2M schematically illustrates solder resist layers 52, 53, which are laminated on the metal layers 50, 51, respectively. The solder resist layers 52, 53 are structured to expose portions of the metal layers 50, 51. The exposed portions of the metal layers 50, 51 form external contact pads 54-58. The external contact pads 54-58 allow electrical contact to be made with the power semiconductor chips 10, 20 from outside the device 200. For this purpose, the external contact pads 54 are electrically coupled to the third contact pad 15 of the first power semiconductor chip 10 and the first contact pad 23 of the second power semiconductor chip 20. The external contact pad 55 is electrically coupled to the second contact pad 14 of the first power semiconductor chip 10. The external contact pad 56 is electrically coupled to the first contact pad 13 of the first power semiconductor chip 10. The external contact pad 57 is electrically coupled to the third contact pad 25 of the second power semiconductor chip 20. The external contact pad 58 is electrically coupled to the second contact pad 24 of the second power semiconductor chip 20.

Figure 2N:
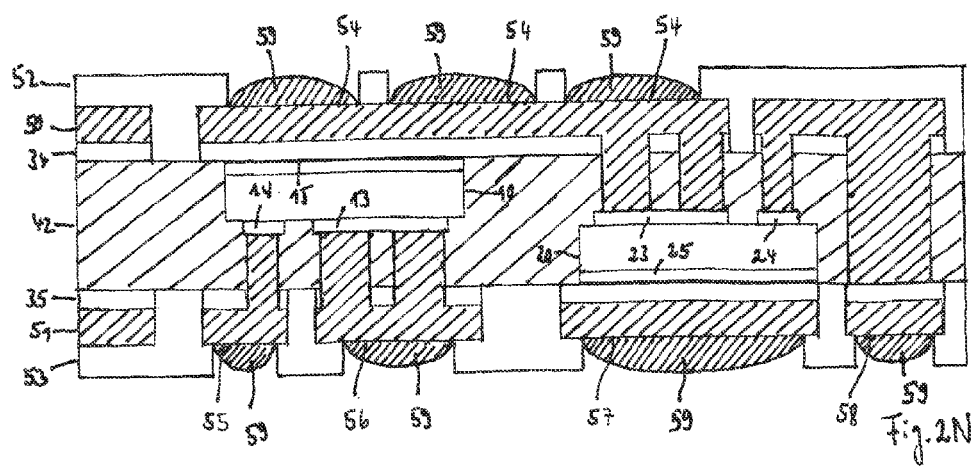
Figure 20:
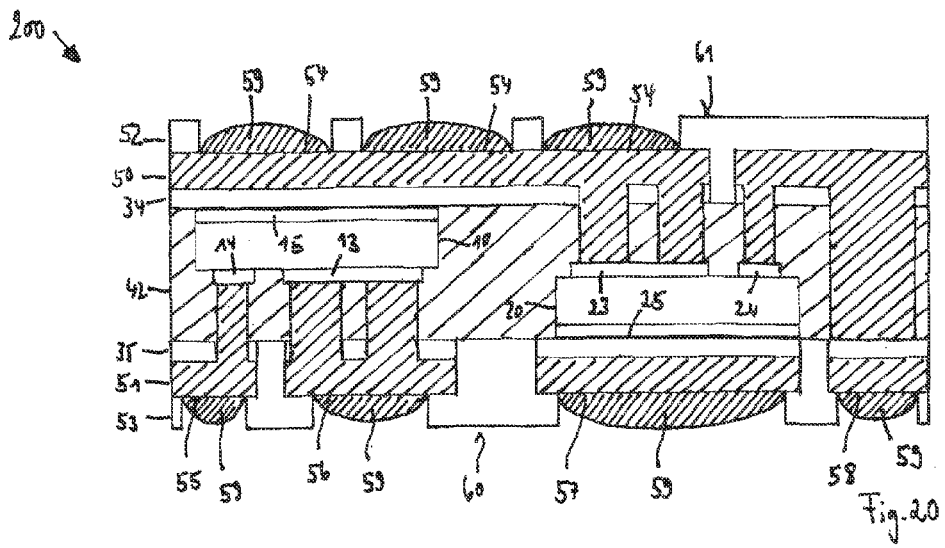

FIG. 2N schematically illustrates solder bumps 59 that are deposited on the external contact pads 54-58 by a printing and reflow process.

FIG. 2O schematically illustrates that the devices 200 are separated from one another by sawing or cutting. The device 200 illustrated in FIG. 2O has two main surfaces 60, 61. Both main surfaces 60, 61 may be used as mounting surfaces to mount the device 200 onto another component, for example, a circuit board, such as a PCB (printed circuit board). Due to the manufacturing process of the device 200, the lateral position of the two power semiconductor chips 10, 20 can be chosen as desired, thus any lateral distance between the power semiconductor chips 10, 20 is possible. The distance between the power semiconductor chips 10, as shown in FIG. 2O improves the heat transfer from the power semiconductor chips 10, 20.

Figure 3:
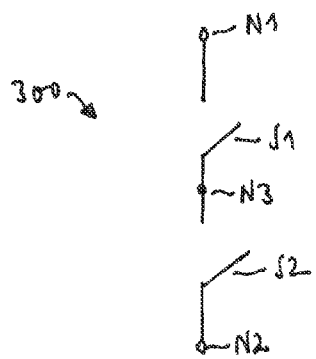
FIG. 3 shows a basic circuit of a half-bridge circuit.

FIG. 3 shows a basic circuit 300 of a half-bridge circuit arranged between two nodes N1 and N2. The half-bridge circuit consists of two switches S1 and S2 connected in series. The power semiconductor chips 20, 10 of the device 200 may be implemented as the switches S1 and S2, respectively. Constant electrical potentials may be applied to the nodes N1 and N2. For example, a high potential, such as 10, 50, 100, 200, 500 or 1000 V or any other potential, may be applied to the node N1 and a low electrical potential, for example, 0V, may be applied to the node N2. Thus, the first power semiconductor chip 10 is the low-side switch, whereas the second power semiconductor chip 20 is the high-side switch. The switches S1 and S2 may be switched at frequencies in the range from 1 kHz to 100 MHz, but the switching frequencies may also be outside this range. This means that a varying electrical potential is applied to a node N3 arranged between the switches S1 and S2 during operation of the half-bridge. The potential of the node N3 varies in the range between the low and the high electrical potential.

The half-bridge circuit may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 4:
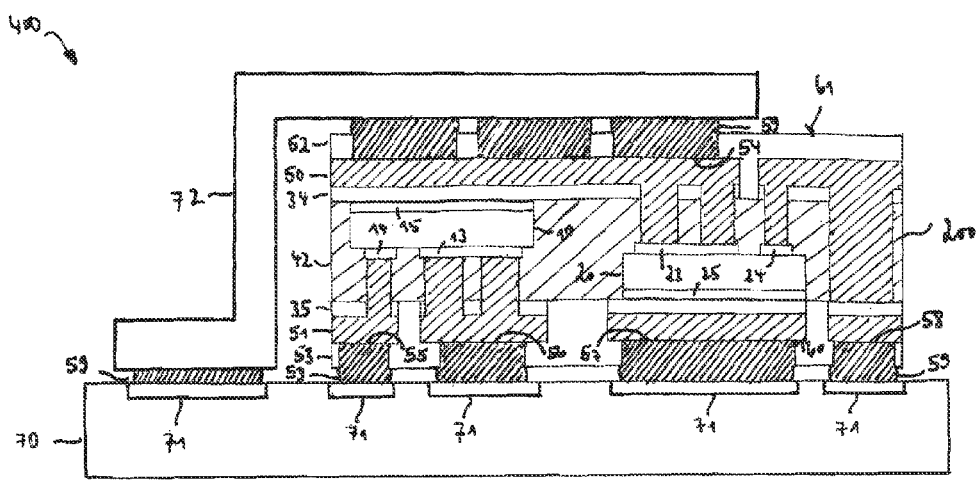
FIG. 4 schematically illustrates a cross-sectional view of one embodiment of a system including the device illustrated in FIG. 2O mounted on a circuit board.

FIG. 4 schematically illustrates a cross-sectional view of a system 400 including the device 200 and a circuit board 70. The device 200 is mounted on the circuit board 70 with the mounting surface 60 facing the circuit board 70. The external contact pads 55-58 of the device 200 are electrically and mechanically coupled to contact pads 71 of the circuit board 70 by the solder bumps 59. In addition, a metallic clip 72 is mounted on the surface 61 of the device 200 and electrically couples the external contact pads 54 of the device 200 to the circuit board 70. Further components, for example, an inductor or a capacitor, may be mounted on the circuit board 70. The system 400 may also serve as a sub-module to be integrated into other systems.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
 a first power semiconductor chip having a first face and a second face opposite the first face, wherein a first contact pad and a second contact pad are arranged on the first face and a third contact pad is arranged on the second face, and wherein a first metal layer is attached to the second face of the first power semiconductor chip; and
 a second power semiconductor chip having a first face and a second face opposite the first face, wherein a first contact pad and a second contact pad are arranged on the first face and a third contact pad is arranged on the second face,
 wherein the first and second power semiconductor chips are arranged such that the first face of the first power semiconductor chip faces in a first direction and the first face of the second power semiconductor chip faces in a second direction opposite to the first direction,
 wherein the first power semiconductor chip is located laterally at least partially outside of an outline of the second power semiconductor chip, and
 wherein the first metal layer electrically couples the third contact pad of the first power semiconductor chip to the first contact pad of the second power semiconductor chip.

2. The device of claim 1, wherein the first power semiconductor chip is located laterally fully outside of the outline of the second power semiconductor chip.

3. The device of claim 1, wherein a surface of the first metal layer forms a first external contact pad.

4. The device of claim 1, wherein the first, second and third contact pads of the first and second power semiconductor chips are source, gate and drain electrodes, respectively.

5. The device of claim 1, wherein the first and second power semiconductor chips are each a power MOSFET, an IGBT, a JFET or a power bipolar transistor.

6. The device of claim 1, wherein the first power semiconductor chip and the second power semiconductor chip are coupled to each other in a half-bridge circuit.

7. The device of claim 1, wherein the first power semiconductor chip and the second power semiconductor chip are the same size.

8. The device of claim 1, further comprising a second metal layer attached to the second face of the second power semiconductor chip.

9. The device of claim 8, wherein the first metal layer and the second metal layer have the same thickness.

10. The device of claim 8, wherein a surface of the second metal layer forms a second external contact pad.

11. A device, comprising:
 a first MOSFET power semiconductor chip having a first face and a second face opposite the first face, wherein a source contact pad and a gate contact pad are arranged on the first face and a drain contact pad is arranged on the second face, wherein a first metal layer is attached to the second face of the first MOSFET power semiconductor chip; and
 a second MOSFET power semiconductor chip having a first face and a second face opposite the first face, wherein a source contact pad and a gate contact pad are arranged on the first face and a drain contact pad is arranged on the second face,
 wherein the first and second MOSFET power semiconductor chips are arranged one above another,
 wherein the first face of the first MOSFET power semiconductor chip faces toward the first face of the second MOSFET power semiconductor chip,
 wherein the first MOSFET power semiconductor chip and the second MOSFET power semiconductor chip are coupled to each other in a half-bridge circuit, and wherein the first metal layer electrically couples the drain contact pad to the first MOSFET power semiconductor chip to the source contact pad of the second MOSFET power semiconductor chip.

12. The device of claim 11, wherein the first MOSFET power semiconductor chip is located laterally fully outside of an outline of the second MOSFET power semiconductor chip.

13. The device of claim 11, wherein the first MOSFET power semiconductor chip is located laterally partially outside of an outline of the second MOSFET power semiconductor chip.

14. The device of claim 11, wherein a surface of the first metal layer forms a first external contact pad.

15. The device of claim 11, wherein a surface of a second metal layer forms a second external contact pad.

16. The device of claim 11, further comprising a second metal layer attached to the second face of the second MOSFET power semiconductor chip.

17. The device of claim 16, wherein the first and the second MOSFET power semiconductor chips have the same thickness.

18. A device, comprising:
a first semiconductor chip having a first face and a second face opposite the first face, wherein a first contact pad and a second contact pad are arranged on the first face and a third contact pad is arranged on the second face, and wherein a first metal layer is attached to the second face of the first semiconductor chip; and
a second semiconductor chip having a first face and a second face opposite the first face, wherein a first contact pad and a second contact pad are arranged on the first face and a third contact pad is arranged on the second face,
wherein the first and second semiconductor chips are arranged such that the first face of the first semiconductor chip faces in a first direction and the first face of the second semiconductor chip faces in a second direction opposite to the first direction,
wherein the first semiconductor chip is located laterally at least partially outside of an outline of the second semiconductor chip, and
wherein the first metal layer electrically couples the third contact pad of the first semiconductor chip to the first contact pad of the second semiconductor chip.

19. The device of claim 18, wherein the first semiconductor chip is located laterally fully outside of the outline of the second semiconductor chip.

20. The device of claim 18, wherein a surface of the first metal layer forms a first external contact pad.

21. The device of claim 18, wherein the first, second and third contact pads of the first and second semiconductor chips are source, gate and drain electrodes, respectively.

22. The device of claim 18, wherein the first semiconductor chip and the second semiconductor chip are coupled to each other in a half-bridge circuit.

23. The device of claim 18, wherein the first semiconductor chip and the second semiconductor chip are the same size.

24. The device of claim 18, further comprising a second metal layer attached to the second face of the second semiconductor chip.

25. The device of claim 24, wherein the first metal layer and the second metal layer have the same thickness.

26. The device of claim 24, wherein a surface of the second metal layer forms a second external contact pad.

* * * * *